United States Patent
Briot et al.

(10) Patent No.: US 6,966,948 B2
(45) Date of Patent: Nov. 22, 2005

(54) METHOD TO MANUFACTURE INDIUM NITRIDE QUANTUM DOTS

(75) Inventors: Olivier Briot, Jacou (FR); Bernard Gil, Montpellier (FR); Sandra Ruffenach, Montarnaud (FR)

(73) Assignees: Centre National de la Recherche Scientifique (C.N.R.S.), Paris (FR); Universite de Montpellier II, Montpellier Cedex (FR)

( * ) Notice: Subject to any disclaimer, the term of this patent is extended or adjusted under 35 U.S.C. 154(b) by 45 days.

(21) Appl. No.: 10/689,841

(22) Filed: Oct. 22, 2003

(65) Prior Publication Data

US 2005/0028726 A1    Feb. 10, 2005

Related U.S. Application Data

(60) Provisional application No. 60/493,452, filed on Aug. 8, 2003.

(51) Int. Cl.$^7$ ......................... C30B 25/12; C30B 25/14

(52) U.S. Cl. ........................ 117/104; 438/962

(58) Field of Search ................. 438/962; 117/104

(56) References Cited

U.S. PATENT DOCUMENTS

| | | | |
|---|---|---|---|
| 6,177,684 B1 * | 1/2001 | Sugiyama | 257/17 |
| 6,645,885 B2 * | 11/2003 | Chua et al. | 438/509 |
| 2003/0059971 A1 | 3/2003 | Chua et al. | |

FOREIGN PATENT DOCUMENTS

| | | |
|---|---|---|
| EP | 1 389 814 A2 | 2/2004 |
| JP | 2000 315653 | 3/2001 |
| JP | 2000 315654 A | 3/2001 |
| WO | WO 00/07221 | 2/2000 |

OTHER PUBLICATIONS

Yuan et al; "Electrically Driven Single-Photon Source"; Science; Jan. 2002, pp. 102-105; XP002278163.

Briot et al; "Indium nitride quantum dots grown by metalorganic vapor phase epitaxy"; Applied Physics Letters, American Institute of Physics; vol. 83, No. 14; pp 2919-2921, XP001189952; Oct., 2003.

Schallenberg et al; "Controlled self-assembly of semiconductor quantum dots using shadow masks"; Applied Physics Letters, American Institute of Physics; vol. 82, No. 24; Jun., 2003; pp. 4349-4351; XP001175289.

Williams et al; "Controlling the self-assembly of InAs/InP quantum dots"; Journal of Crystal Growth; vol. 223, No. 3, Mar. 2001; pp. 321-331; XP004229645.

* cited by examiner

Primary Examiner—Felisa Hiteshew
(74) Attorney, Agent, or Firm—Stites & Harbison PLLC; Ross F. Hunt, Jr.

(57) ABSTRACT

The invention concerns a method for manufacturing sizeable quantum dots of Indium Nitride in which a layer of Indium Nitride is grown onto a layer of crystalline buffer. The crystalline buffer is chosen with a lattice structure similar to the lattice structure of Indium Nitride and with the lattice mismatch between Indium Nitride and the crystalline buffer being greater than 5%. During the growth of Indium Nitride, surface strains are produced by the crystalline buffer, allowing the Indium Nitride to self-organize onto the crystalline buffer so as to form a plurality of sizeable quantum dots.

10 Claims, 3 Drawing Sheets

METHOD TO MANUFACTURE INDIUM NITRIDE QUANTUM DOTS

This application claims benefit of U.S. Provisional Application No. 60/493,452, filed Aug. 8, 2003.

The present invention relates generally to the field of nanotechnology used for manufacturing telecom devices and, more particularly, to the manufacture of Indium Nitride quantum dots and of electrically driven single photon sources based on those quantum dots.

It has been demonstrated, by using other materials, that single photon emitters could be realized from low-density semiconductor quantum dots. More recently, an electrically driven single photon source was demonstrated, where the recombination of a confined exciton (created by electrical injection) leads to a single photon emission (Z. Yuan, B. E. Kardynal, R. M. Stevenson, A. J. Shields, C. Lobo, K. Cooper, N. S. Beattie, D. A. Ritchie and M. Pepper, Science 295 (2002), p. 102). Such devices are requested for tomorrow's secure networks, since it has been established that the quantum of single photon allows overcoming the threat of eavesdropping attacks.

The Indium Nitride (InN) is a material, which has received considerable attention when it was discovered that its band gap could be close to the 0.7–0.75 eV, window, which is very useful for infrared communications. Since nitride semiconductors, such as Gallium Nitride, have been very successful in the realisation of optoelectronics device, it was expected that the Indium Nitride could be used in such devices.

Compared to the experiments described above, which operate at a temperature of 5K, nitride semiconductors, especially Indium Nitride, will operate hopefully at higher operating temperatures, due to their large Rydberg energies and consequently to their exciton being more thermally robust, making them materials of choice for manufacturing such single photon source.

However, the growth of good quality Indium Nitride was more difficult than expected. The first successful single crystalline InN growth was reported by Matsuoka and al. in 1989 (International Symposium on GaAs and Related Compounds, Karuizawa, 1989, Inst. Phys. Conf. Ser. 106,141 (1990)) using Metal Organic Vapour Phase Epitaxy (MOVPE). MOVPE, however, has an inherent disadvantage because it must satisfy the conditions for ammonia pyrolysis and prevention of Indium Nitride dissociation, which impose conflicting temperature requirements even if properties of InN grown by this method have been much improved very recently by A. Yamamoto and al. (Improved Electrical Properties for Metalorganic Vapour Phase Epitaxial InN Films, phys. Stat. sol. (a) 194, n°2, 510–514 (2002)). A second growth method is to use the RF-plasma excited molecular beam epitaxy (RF-MBE) (Y. Nanishi, MBE-growth, Characterization and Properties of InN and InGaN). However, although the intrinsic quality of Indium Nitride makes it a good candidate to produce such devices, it was up to now impossible to manufacture Indium Nitride with the required characteristics to become a single photon source.

The present invention provides for a method to manufacture such Indium Nitride quantum dots able to operate as single photon source.

More particularly one object of the present invention is to provide for a device in which the surface density of InN quantum dots is sufficiently low to allow a single quantum dot to be isolated by using standard means of microelectronics processes such as photolithography, etching, and the like, with this isolated quantum dot forming a single photon source transmitter and/or receiver allowing given structures dedicated to quantum cryptography applications to be embodied.

Another object of the invention is thus to provide for a method for manufacturing a single photon source where the temperature is one of the essential parameters to control the size of the quantum dots and corresponding photon sources and, consequently, the wave length of the emitted/received photon.

Another object of the invention is a layered unit obtained by this method, in which the surface density of quantum dots onto one of its surfaces is less than $10^8$ cm$^{-2}$.

Another object of the invention is such a layered unit in which one of the quantum dots has been isolated, so as to form a single photon source.

The method for manufacturing such InN quantum dots which is the object of the invention consists at least to use a substrate such as a sapphire on which a layer of crystalline buffer is deposited. This buffer is chosen so among materials having a similar lattice structure than the InN but with a different lattice cell size in order to have a lattice mismatch between the buffer and InN of at least 5%. Gallium Nitride and Aluminium Nitride are two materials having these characteristics.

When InN is being grown onto the buffer, the lattice mismatch creates surface strains and, provided that the InN molecules have a sufficient thermal mobility, InN can thus self-organise into islands, or dots.

The layered unit of the invention comprises at least Gallium Nitride or Aluminium Nitride buffer, and a plurality of Indium Nitride quantum dots deposited onto this buffer, with the surface density of the quantum dots being less than $10^8$ cm$^{-2}$.

The objectives, advantages and particulars of the present invention will be understood by reading the following detailed description and accompanying drawings, in which.

The following detailed description contains many particulars for the purposes of sole illustration. These specifics are given as exemplary details belonging to the scope of the invention.

Figure 1:
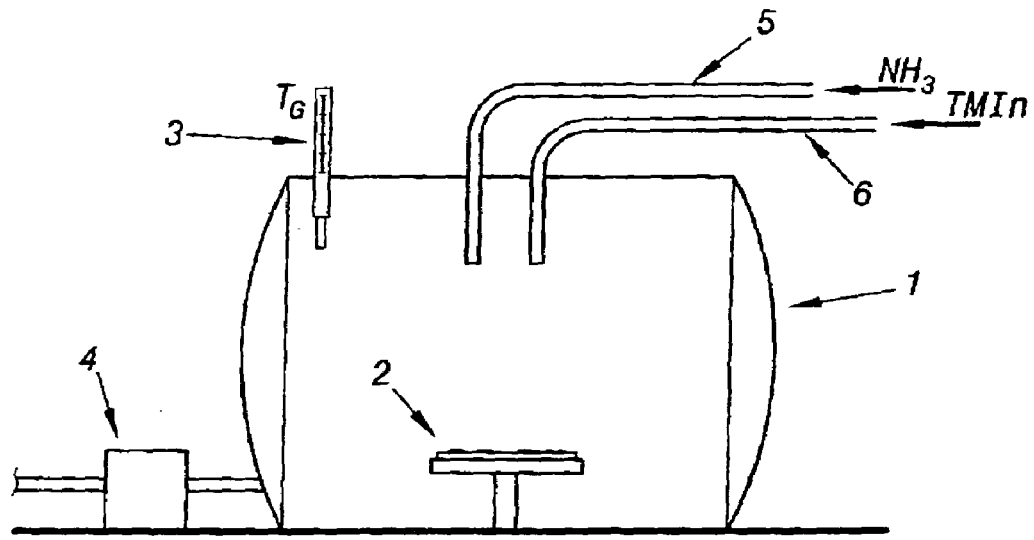
FIG. 1 shows the schematics of an epitaxy reactor used by the described method.
Figure 2:
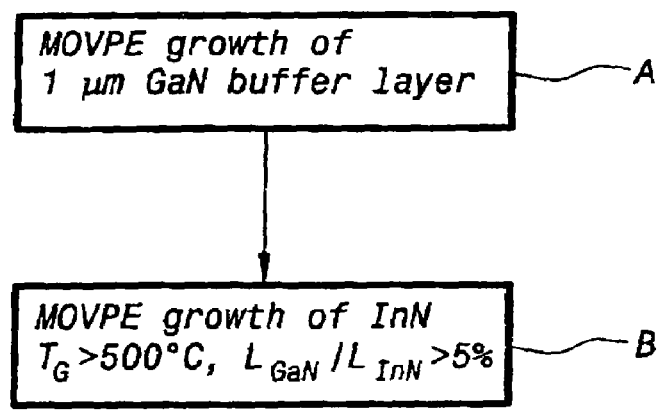
FIG. 2 shows a general flow chart of the method to manufacture InN quantum dots according to the invention.

The method for growing InN quantum dots is now disclosed in relation with FIGS. 1 and 2.

The described method will use the well-known technique of Metal Organic Vapor Phase Epitaxy (MOVPE) to grow materials on top of a substrate which is a wafer of sapphire or a wafer of silicon carbide for instance.

MOVPE uses a reactor 1 with a chamber in which is installed the substrate 2. This reactor has means to control the temperature 3, means to maintain a given pressure 4 inside the chamber, means to inject gases 5 and 6 which will be the precursors of the chemical reaction. As an example, the inventors have used an AIXTRON RF/S.

To create physical strains during the growth of InN, physical strains which will create a self-organisation of InN molecules into quantum dots, InN will be deposited on a layer of Gallium Nitride (GaN). GaN will create a Stransky-Krastnov growth mode of InN, which is mostly promoted by the lattice mismatch $((a_{InN}-a_{GaN})/a_{GaN})$ of at least 5% between GaN and InN. Stransky-Krastanov growth mode is a technical process which is well known by the person skilled in the art and that will not be disclosed in detail for this reason. Though the description of the method of the invention will be done with GaN, the person skilled in the art may deduce that any other material having a structure able to create a Stransky-Krastanov effect can be used. Another such material is the Aluminium Nitride.

As shown in FIG. 2, as a preliminary step A, MOVPE is used to grow a buffer layer of Gallium Nitride onto the sapphire. This buffer layer will be 1 $\mu$m thick. This process is well known per se and will not be disclosed in further detail for this reason.

On top of this buffer layer, InN is further deposited at step B using as precursors of the chemical reaction, Tri-Methyl-Indium (TMIn) and ammonia (NH3).

The reactor is set up with a working pressure in the range of 10 000 to 40 000 Pa and with a flow rate of 20 to 200 cm$^3$/mn for TMIn and in the range of 2000 to 4200 cm$^3$/mn for ammonia.

It is well known by the person skilled in the art that these parameters are correlated to the reactor type used. They are given here only as an example of working conditions of the process of the invention.

Figure 3:
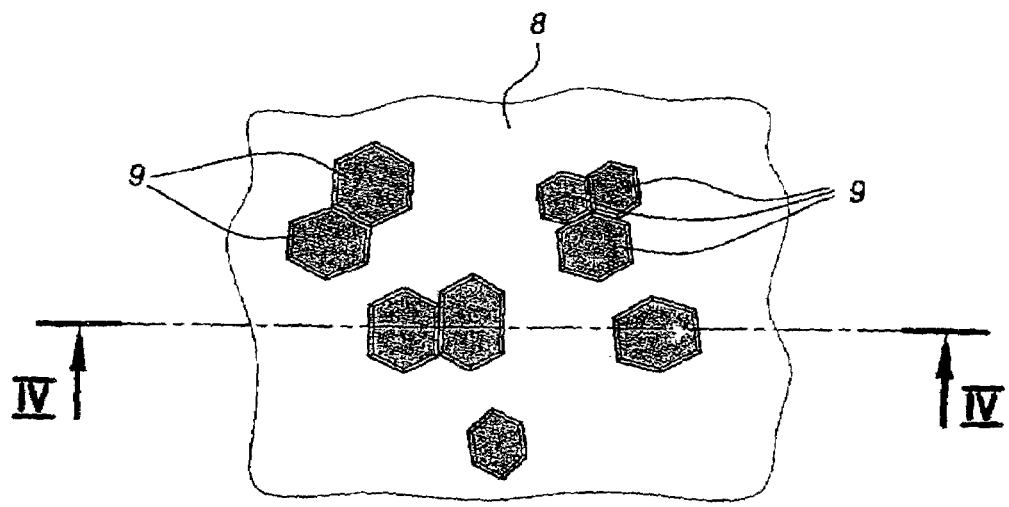
FIG. 3 shows a plan view of a portion of an integrated circuit with some InN quantum dots.
Figure 4:
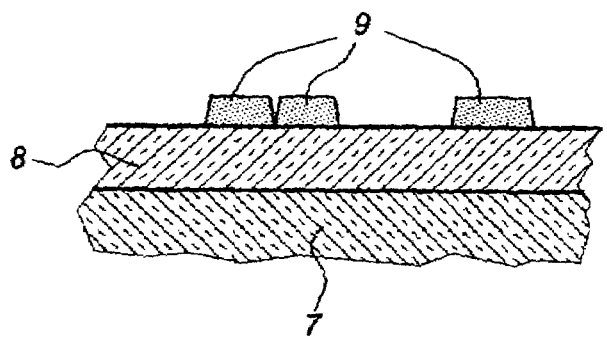
FIG. 4 shows the cross section IV—IV of FIG. 3.

FIGS. 3 and 4 illustrate the typical result of the method of the invention. InN quantum dots, with a substantially hexagonal structure, are disseminated onto the GaN buffer layer.

The three main parameters which control the method of the invention are the growth temperature $T_G$, the molar ratio between ammonia and TMIn (the V/III molar ratio) and the deposition time. Other parameters for embodying the method of the invention like ammonia and TMIn pressure are known as such and are not essential to the method of the invention.

InN is known to have a low decomposition temperature, in the range of 550° C. at equilibrium, as compared to other nitrides. This explains the difficulty to grow high-quality InN by using MOVPE process which typically, according to the method of the invention, allows using a growth temperature in the range of 500° C. to 650° C. The method of the invention uses such a high temperature to obtain a high crystalline quality and a low surface density of dots, so as to favour desorption and surface mobility of InN. However, it appears that a high temperature of 650° C. produces also remarkably degraded material, setting the upper limit of the method of the invention.

The second parameter of major interest to embody the method of the invention is the V/III molar ratio which is preferably selected in the range of 7150 to 30 000. The growth temperature and the V/III selected molar ratio are two related parameters: as the ammonia cracking efficiency exponentially decreases with temperature, it is necessary to increase the injected ammonia flow, thus increasing the V/III molar ratio so as to maintain a good material quality at lower temperatures. For instance, a low growth temperature of 500° C. and a V/III molar ratio of 7150 will produce only Indium droplets.

The last parameter of particular interest to control is the deposition time. It may preferably vary from 10 seconds up to 3600 seconds and can thus be used to control the dots size as it will be explained in detail there after.

Figure 5:
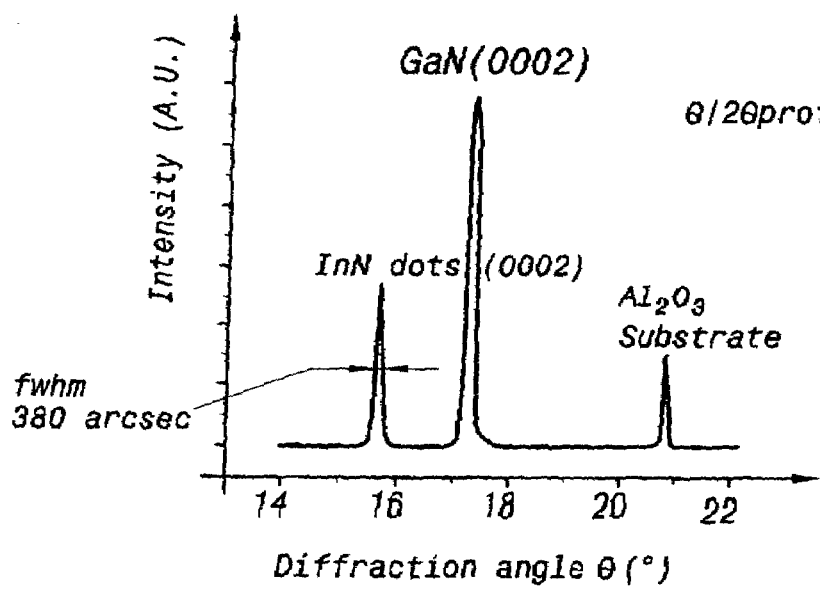
FIG. 5 shows the result of a x-ray diffraction experiment on InN quantum dots grown at 625° C.
Figure 6:
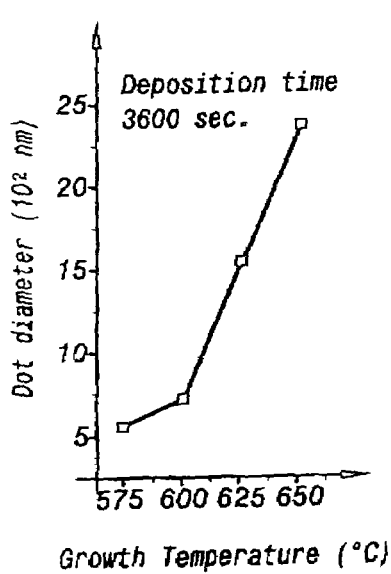
FIGS. 6 and 7 show diagrams illustrating the relationship between the quantum dot diameter size, the quantum dot density and the growth temperature.
Figure 7:
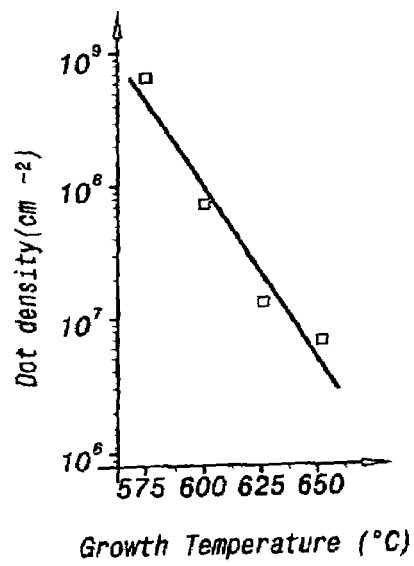

A first experiment was carried out using a V/III molar ratio of 7150, a deposition time of 3600 seconds and a growth temperature varying between 575° C. and 650° C. FIG. 5 shows the result of a x-ray diffraction experiment on a corresponding InN quantum dot grown at 625° C.: it establishes the high crystalline quality of the InN dots, similar to the GaN buffer layer. FIG. 6 and FIG. 7 illustrate the variation of dots size and dots density as a function of the growth temperature by plotting the results of Atomic Force Microscopy (AFM) measurements. At 625° C., the dots density appears to be extremely low, reaching $10^7$ cm$^{-2}$ only. This is an important achievement and feature of the method and integrated circuit of the invention allowing single photon emitters/receivers to be obtained.

Figure 8:
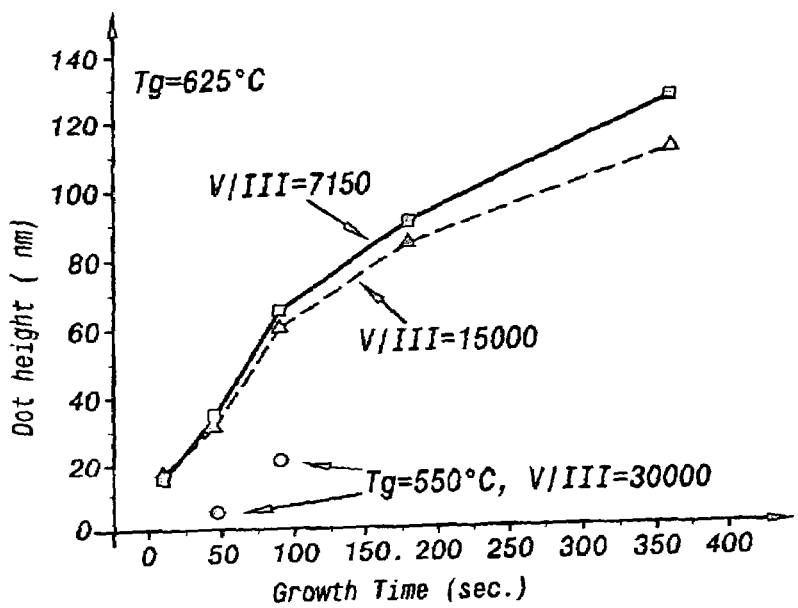
FIG. 8 shows the relationship between dots height and deposition time for a given growth temperature and a given V/III molar ratio.

A second experiment was carried out with a fixed growth temperature of 625° C. but with 3 different V/III molar ratios of 7150, 15000 and 30000 and a deposition time varying in between 10 and 360 seconds. The experiment results, relating to the dot height parameter, are plotted in FIG. 8. By comparing FIG. 6 and FIG. 8, it thus appears that the diameter/height ratio of quantum dots is typically around 10. This substantially flat geometry clearly originates from a high surface diffusion induced by the growth conditions. Another conclusion drawn from FIG. 8 is that the dots size is not linearly changing with the deposition time since strain effects are affecting the smallest dots while the largest ones are mainly relaxed. Finally, it can be noticed that the use of a larger V/III molar ratio decreases the average growth rate and consequently the dot size. This effect may be explained by a competitive adsorption on crystal size.

Further experiments were carried out at low temperature but with a higher V/II molar ratio. As explained here above, with a V/III molar ratio of 7150 and a growth temperature of 550° C., only Indium droplets were produced due to the rate of decomposition of ammonia. However by increasing the V/III molar ratio to 15000 to compensate this high rate of decomposition, it is possible to grow good quality InN dots at a temperature of 550° C. As shown in FIG. 8, with these preceding conditions and a deposition time of 45 seconds, the diameters of InN dots are in between 25 and 35 nm (with heights of 2.7 and 5.6 nm respectively).

The result of the method of the invention will be a layered unit, or a wafer, composed of a substrate, of sapphire for instance, with a 1 $\mu$m thick buffer layer of GaN, on top of which is deposited InN quantum dots with a diameter in between 25 nm and 2000 nm. As explained above, the dots size can be controlled by using the growth temperature, the V/II molar ratio and the deposition time. In the photon source application, the wave length of the emitted/received photon is directly related to the size of the quantum dot used. Therefore, the method of the invention can be used to obtain photon sources adjusted to the desired wave length.

Another particularity of the result of the method of the invention is the low InN quantum dots density. The described experiments have shown that a density as low as $10^7$ cm$^{-2}$ can be obtained. With the standard means of the microelectronics industry, such as photolithography, dry-etching, and the like, which are able to manufacture integrated circuit with geometry lower than 1 $\mu$m, such a low density allows isolating quantum dots to build up a single photon source.

Although the Detailed Description of the invention has been directed to certain exemplary embodiments, various modifications of these embodiments, as well as alternative embodiments, will be suggested to those skilled in the art.

The invention encompasses any modifications or alternative embodiments that fall within the scope of the claims.

What is claimed is:

1. An layered unit comprising at least a Gallium Nitride or a Aluminum Nitride buffer, and a plurality of Indium Nitride quantum dots deposited onto said buffer, the surface density of said quantum dots being less than $10^8$ cm$^{-2}$.

2. The layered unit of claim 1, wherein one single quantum dot of said plurality of quantum dots is isolated by microelectronics means so as to form a single photon source.

3. A method for manufacturing sizeable quantum dots of Indium Nitride comprising at least growing of an Indium Nitride layer onto a layer of crystalline buffer, said Indium Nitride and said buffer having a similar lattice structure with a lattice mismatch between said Indium Nitride and said buffer being greater than 5%, so as to produce surface strains allowing the Indium Nitride to self-organize onto said buffer so as to form a plurality of sizeable quantum dots.

4. The method of claim 3, wherein the Indium Nitride has a growth temperature of at least 500° C., said temperature allowing controlling the size of said quantum dots.

5. The method of claim 4, said method further uses at least one of said growth temperature and said surface strains so as to obtain a surface density of said quantum dots less than $10^8$ cm$^{-2}$, 6. The method of claim 5, said method further including isolating at least one quantum dot of said plurality of quantum dots by microelectronics means so as to form a single photon source.

7. The method of claim 3, wherein said crystalline buffer is made of Gallium Nitride or Aluminum Nitride.

8. The method of claim 3, wherein the growth of Indium Nitride is done by the process of Metal Organic Vapor Phase Epitaxy.

9. The method of claim 8, wherein the gazes used to perform said Metal Organic Vapor Phase Epitaxy process are TMIn and ammonia.

10. The method of claim 9, wherein the ammonia and TMIn has a molar ratio above 7150.

* * * * *